(12) United States Patent
Edgar et al.

(10) Patent No.: US 7,613,966 B2
(45) Date of Patent: Nov. 3, 2009

(54) HYPERJTAG SYSTEM INCLUDING DEBUG PROBE, ON-CHIP INSTRUMENTATION, AND PROTOCOL

(75) Inventors: Ernest Lewis Edgar, Larkspur, CO (US); Bruce J. Ableidinger, Portland, OR (US)

(73) Assignee: MIPS Technologies, Inc., Mountain View, CA (US)

( * ) Notice: Subject to any disclaimer, the term of this patent is extended or adjusted under 35 U.S.C. 154(b) by 0 days.

(21) Appl. No.: 12/348,847

(22) Filed: Jan. 5, 2009

(65) Prior Publication Data

US 2009/0119555 A1 May 7, 2009

Related U.S. Application Data

(63) Continuation of application No. 11/026,324, filed on Dec. 29, 2004, now Pat. No. 7,475,303.

(60) Provisional application No. 60/533,331, filed on Dec. 29, 2003.

(51) Int. Cl.
    *G01R 31/28* (2006.01)
(52) U.S. Cl. ........................... 714/724
(58) Field of Classification Search ............... None
    See application file for complete search history.

(56) References Cited

U.S. PATENT DOCUMENTS

| | | | |
|---|---|---|---|
| 5,712,858 A * | 1/1998 | Godiwala et al. | 714/724 |
| 5,875,293 A * | 2/1999 | Bell et al. | 714/27 |
| 6,272,137 B1 | 8/2001 | Noiri | |
| 6,460,171 B1 | 10/2002 | Couvert et al. | |
| 6,560,734 B1 | 5/2003 | Whetsel | |

(Continued)

OTHER PUBLICATIONS

Collins, Robert R., "In-Circuit Emulation—A Powerful Hardware Tool for Software Debugging", http://www.rcollins.org/ddj/Jul97/, 5 pages, copyright 1991-1999.

(Continued)

*Primary Examiner*—Christine T Tu
(74) *Attorney, Agent, or Firm*—Cooley Godward Kronish LLP

(57) ABSTRACT

A system for simultaneously interfacing multiple test instruments with multiple processor cores includes an on-chip instrumentation, a probe, and a connection mechanism for providing a transmission path between the probe and the on-chip instrumentation. The on-chip instrumentation includes an on-chip instrumentation concentrator and an on-chip instrumentation de-concentrator. The probe includes a probe concentrator and a probe de-concentrator. The probe concentrator concentrates signals from the test instruments into a first serial signal stream for transmission over the connector mechanism. The on-chip instrumentation de-concentrator de-concentrates the first serial signal stream into signals to be directed to at least one of the processor cores. The on-chip instrumentation concentrator concentrates signals from the processor cores into a second serial signal stream for transmission over the connector mechanism. The probe de-concentrator de-concentrates the second serial signal stream into signals to be directed to at least one of the testing instruments. Using this system, the testing instruments are able to simultaneously access and control respective processor cores. In one preferred embodiment the plurality of signals are directed to the processor cores using a plurality of loops, each loop having a chain of nodes, each of the processor cores connected to a respective node.

5 Claims, 15 Drawing Sheets

U.S. PATENT DOCUMENTS

| | | |
|---|---|---|
| 6,584,590 B1 | 6/2003 | Bean |
| 6,643,810 B2 | 11/2003 | Whetsel |
| 6,678,645 B1 | 1/2004 | Rajsuman et al. |
| 6,785,854 B1 | 8/2004 | Jaramillo et al. |
| 6,944,132 B1 | 9/2005 | Aono et al. |
| 7,100,086 B1 * | 8/2006 | Kudo et al. .................. 714/30 |

OTHER PUBLICATIONS

Dada, Gerardo A., "Reducing Time to Market: Parallel Software Development with Emulation and Simulation Tools for MXC Architectures", Motorola, Digital dna, White Paper, Motorola, Inc. 16 pages (2004).

Leatherman, Rick et al., "Processor and System Bus on Chip Instrumentation", at 14 pages, at least as early as Dec. 29, 2004.

Stollon, Neal et al., "Multi-Core Embedded Debug for Structured ASIC Systems", DesignCon 2004, http://www.designcon.com/conference/2004/2-TA3.pdf, 23 pages (2004).

Stollon, Neal et al., "A Reconfigurable Bus IP for Modular Function Integration", ACM, 6 pages, copyright 2000.

Veal, Robert L. et al., "Multi-Core SoC Platform Integration Using AMBA", DesignCon 2002 System on Chip and IP Design Conference, Infinite Technology Corporation, 18 pages (2002).

Vermeulen, Bart et al., "Test and Debug Strategy of the PNX8525 Nexperia Digital Video Platform System Chip", ITC International Test Conference, IEEE, pp. 121-130 (2001).

Wilson, Ron, "PalmChip Bus Patent Threatens Most SoCs", http://www.eetimes.com/story/OEG20030801S0043, 4 pages, Aug. 4, 2003.

* cited by examiner

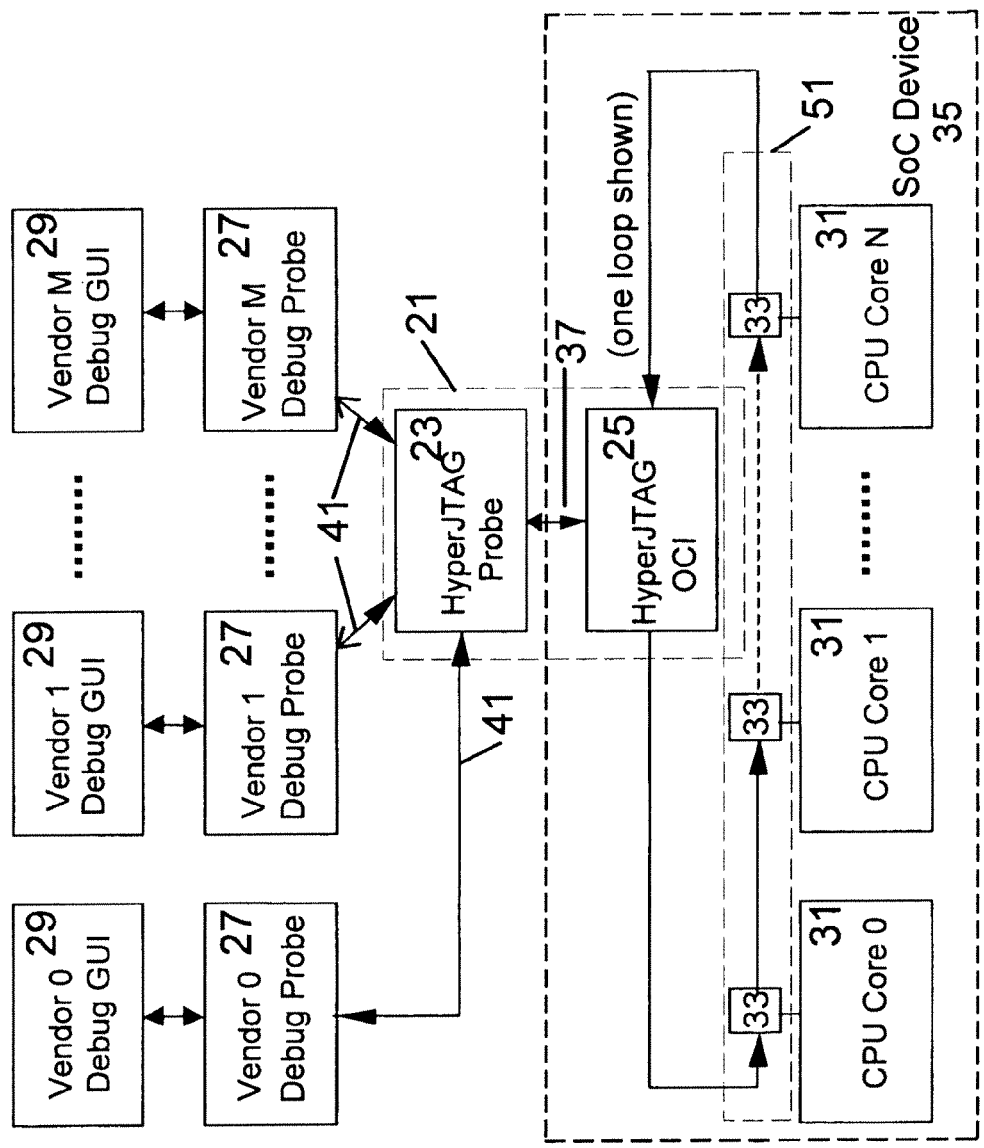
FIG. 1: SoC Fig.HyperJTAG Architecture

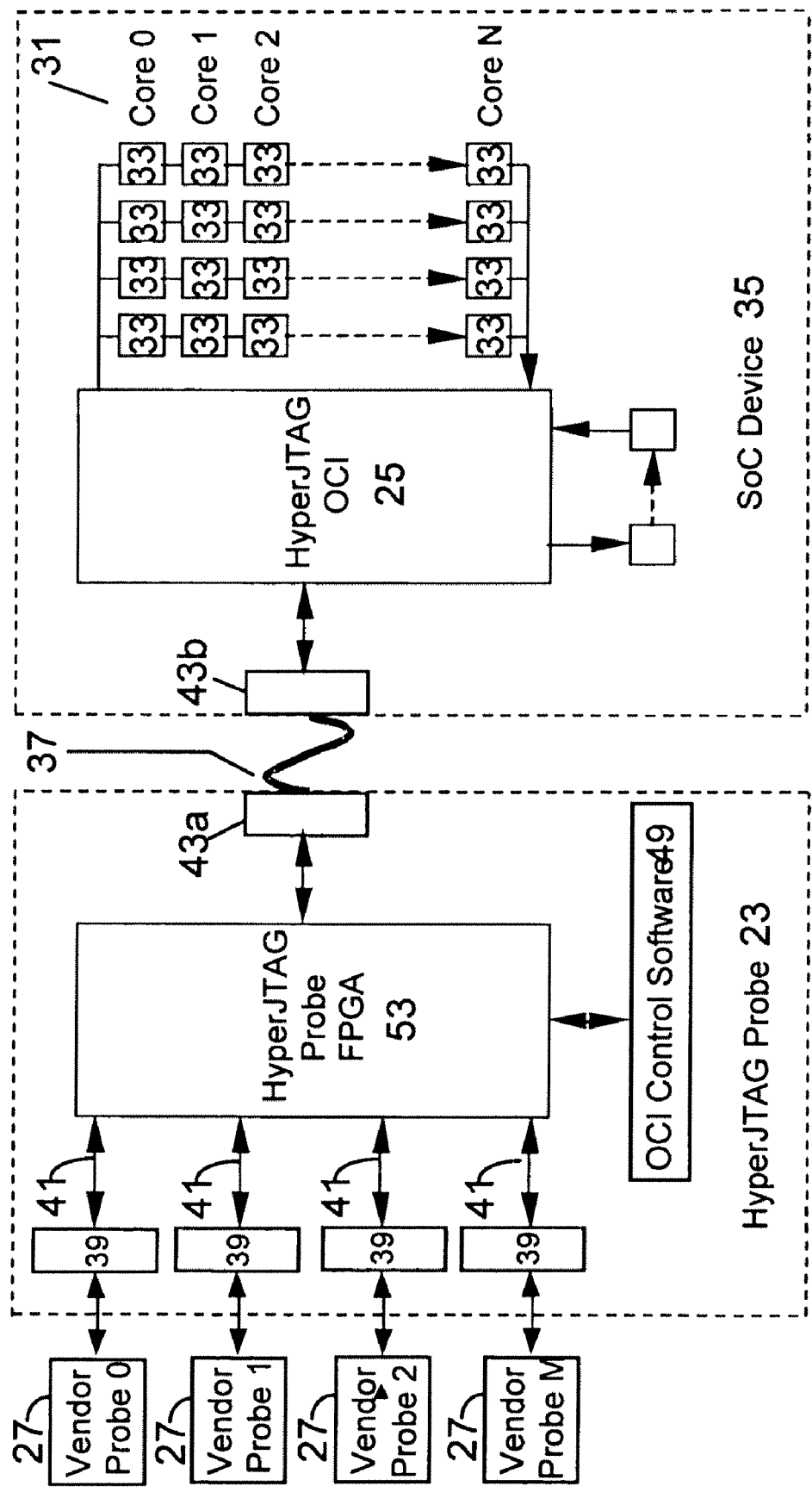
FIG. 2: HyperJTAG Overview

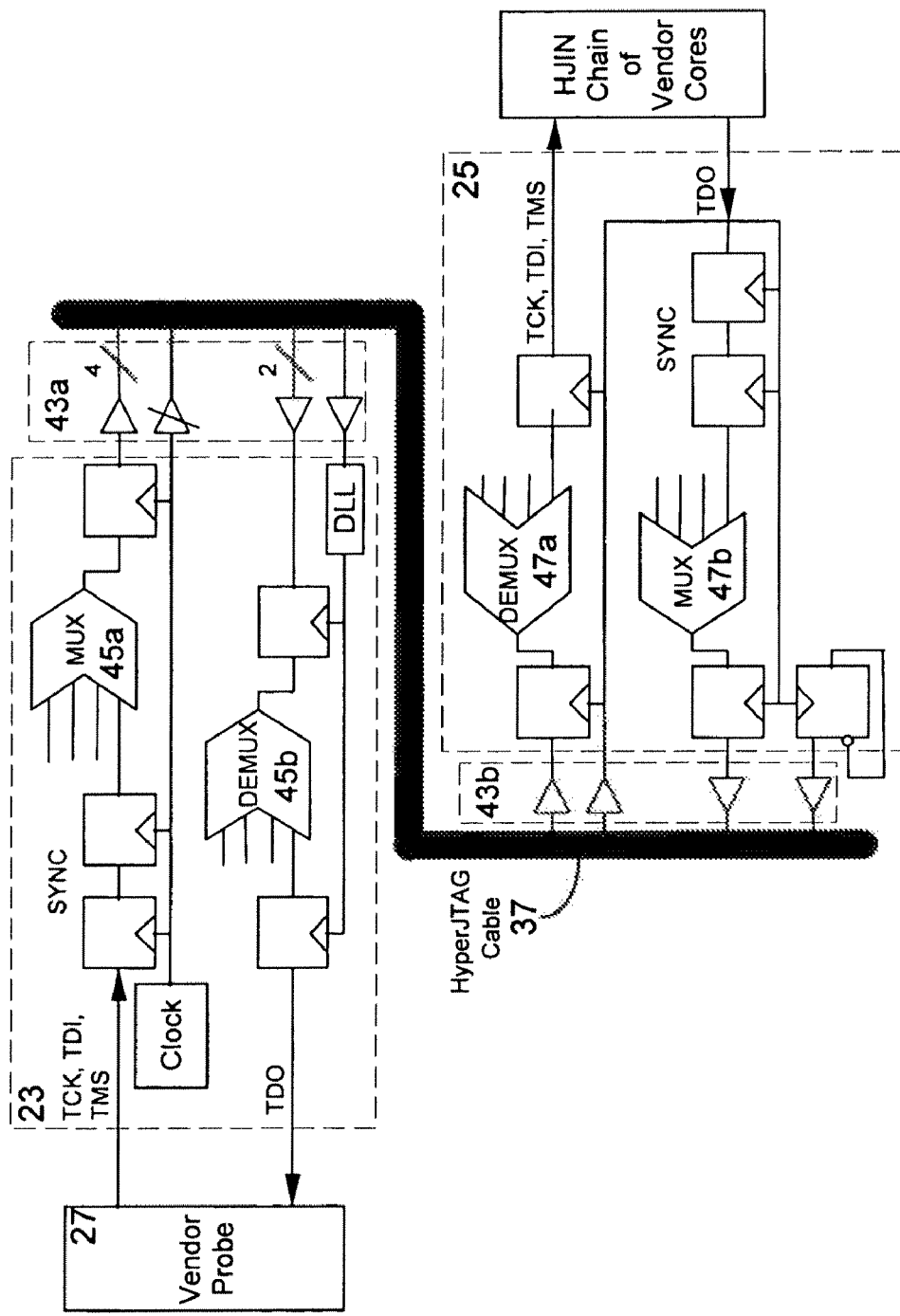
FIG. 3: HyperJTAG Dataflow

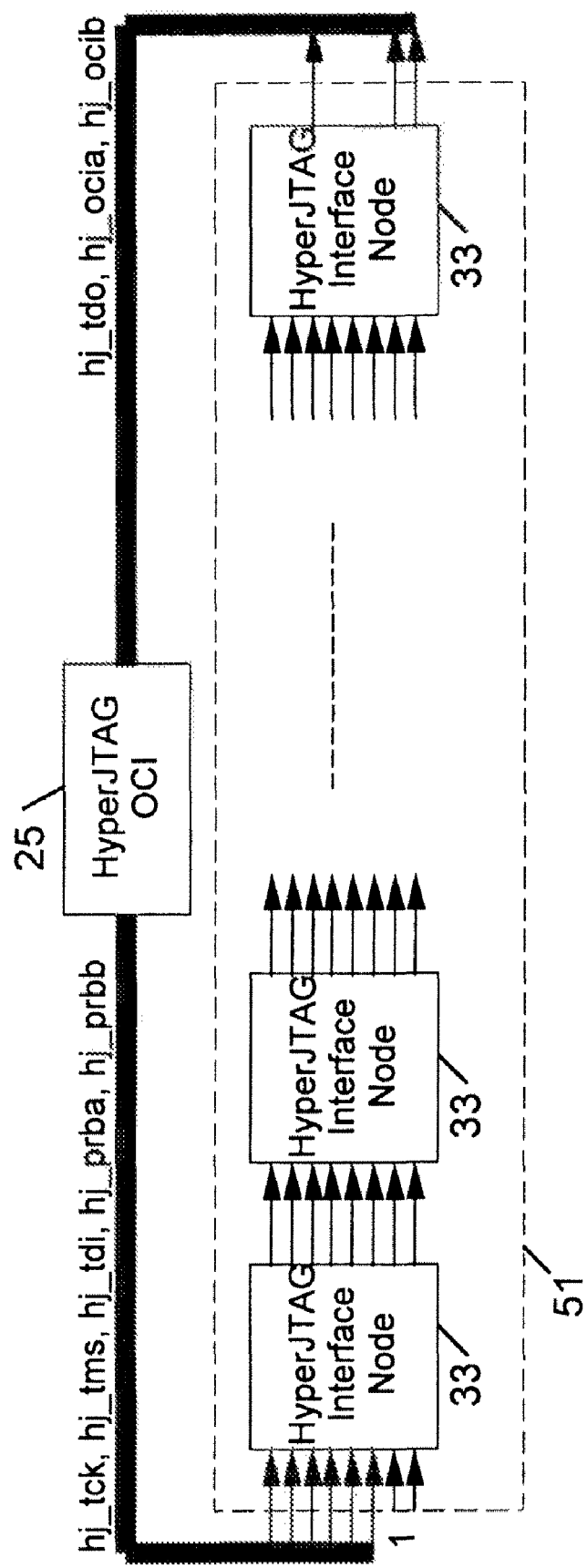
FIG. 4: HyperJTAG Dataflow

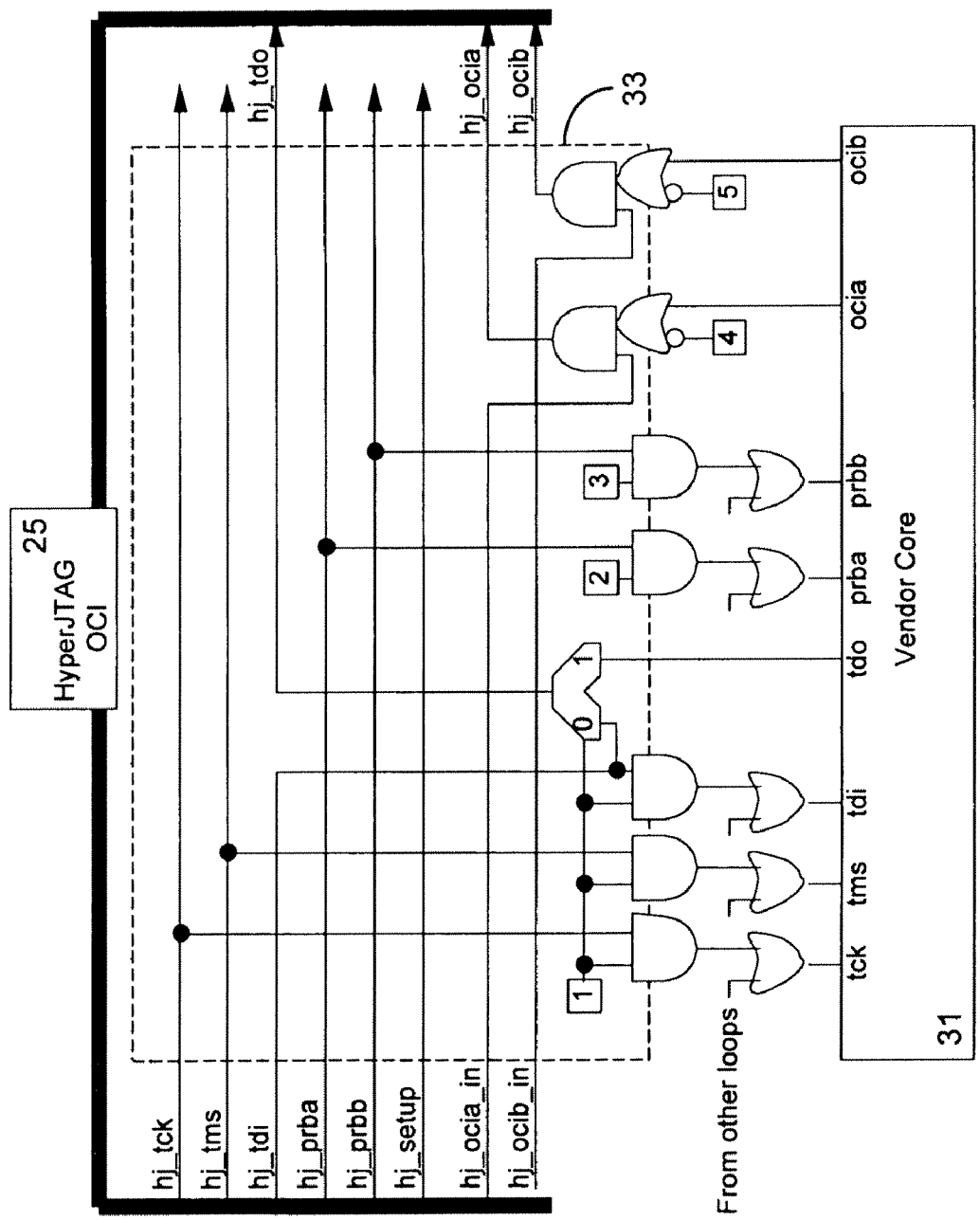
FIG. 5: HyperJTAG Interface Node

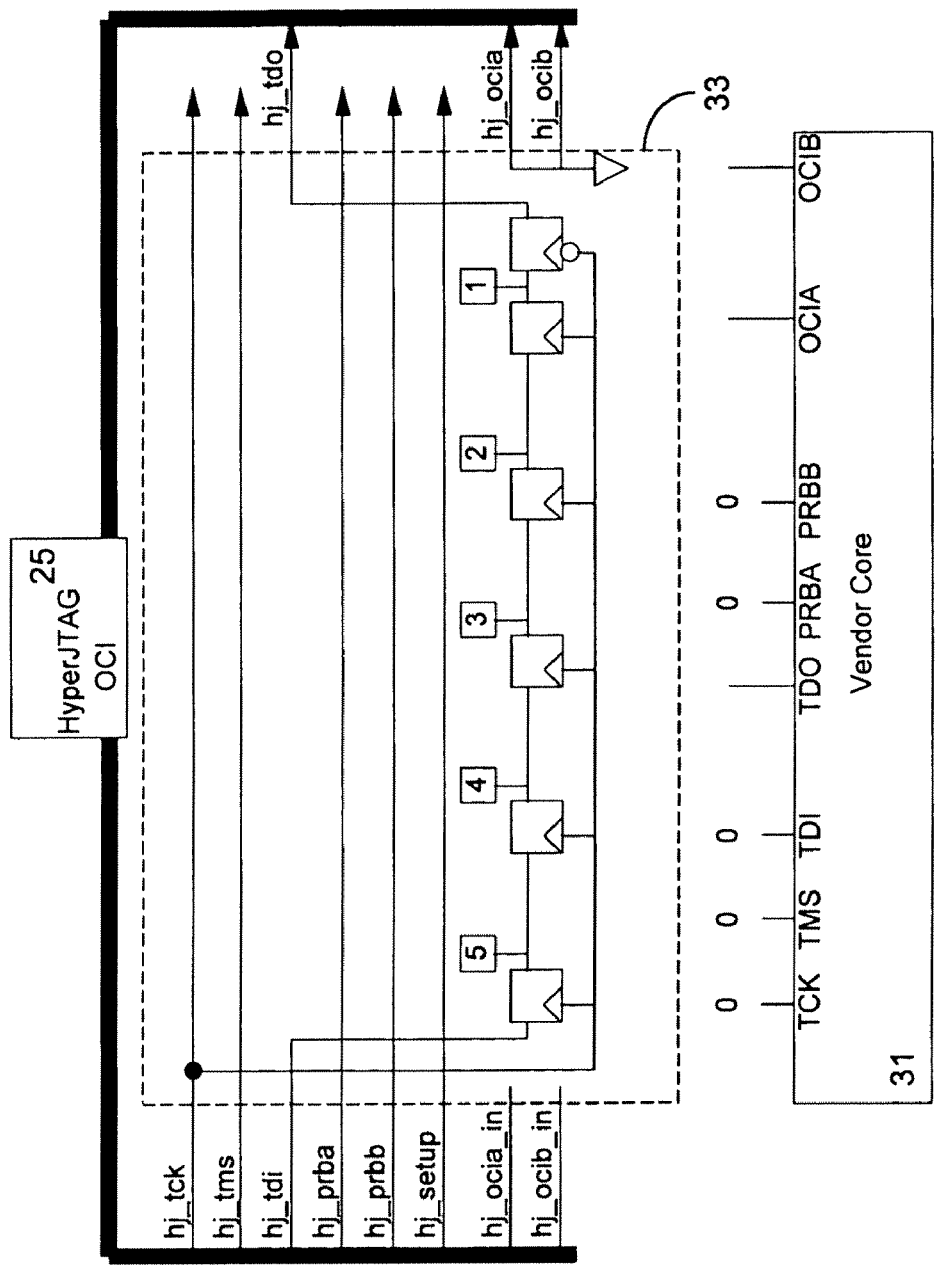
FIG. 6: HyperJTAG Interface Node in Setup Mode

| JTAG | MIPS 2.5/2.6 | ARM | ZSP500 |
|---|---|---|---|
| TCK | TCK | TCK | TCK |
| TMS | TMS | TMS | TMS |
| TDI | TDI | TDI | TDI |
| TDO | TDO | TDO | TDO |
| PRBA | RST* | nSRST (in) | RST* (in) |
| PRBB | DINT | nTRST | HaltReq |
| OCIA | -- | nSRST (out) | RST* (out) |
| OCIB | -- | RTCK | -- |

FIG. 7: Example HyperJTAG Connections

| Signal name | Source | Purpose |
|---|---|---|
| hjxk | Probe | HyperJTAG Transmit Clock |
| hjxa | Probe | HyperJTAG Transmit Data A |
| hjxb | Probe | HyperJTAG Transmit Data B |
| hjxc | Probe | HyperJTAG Transmit Data C |
| hjmode | Probe | HyperJTAG Mode / Sync |
| hjrk | Device | HyperJTAG Receive Clock |
| hjrd | Device | HyperJTAG Receive Data D |
| hjre | Device | HyperJTAG Receive Data E |

FIG. 8: HyperJTAG Signal List

| | TCK 0 1 2 3 F | TMS 0 1 2 3 F | TDI 0 1 2 3 F | PRBA 0 1 2 3 F | PRBB 0 1 2 3 | Mode | TDO 0 1 2 3 F | OCIA 0 1 2 3 | OCIB 0 1 2 3 |
|---|---|---|---|---|---|---|---|---|---|
| Cycle 0 | A | B | C | | | 1 | D | E | |
| Cycle 1 | A A | B | C | | | 0 | D | E | |
| Cycle 2 | A A | B B | C | | | 0 | D | E | |
| Cycle 3 | A A | B B | C C | | | 0 | D | E | |
| Cycle 4 | A | B | C | B | | 0 | D | | |
| Cycle 5 | A | | | B B | C | 0 | D | | E |
| Cycle 6 | A A | | | B B | C C | 0 | D D | | E E |
| Cycle 7 | A | | | B | C | 0 | D | | E |
| Cycle 8 | A A | | | | | 0 | D | | |
| Cycle 9 | A | | | | | 0 | D | | |

FIG. 9: HyperJTAG Cycle Sequence

| Stage | Max delay | Delay, ns |
|---|---|---|
| Probe TCK synchronization | 2 x CLK | 10 |
| Probe multiplexer | 5 x CLK | 25 |
| Probe output driver |  | 3 |
| Cable delay |  | 2 |
| Device receive register | ½ x CLK | 2.5 |
| Device demultiplexer | 1 x CLK | 5 |
| Device TDO synchronization | 2 x CLK | 10 |
| Device multiplexer | 5 x CLK | 25 |
| Device output driver |  | 3 |
| Cable delay |  | 2 |
| Probe receive register | ½ x CLK | 2.5 |
| Probe demultiplexer | 1 x CLK | 5 |
| Total |  | 95 |

FIG. 10: HyperJTAG Roundtrip Delay

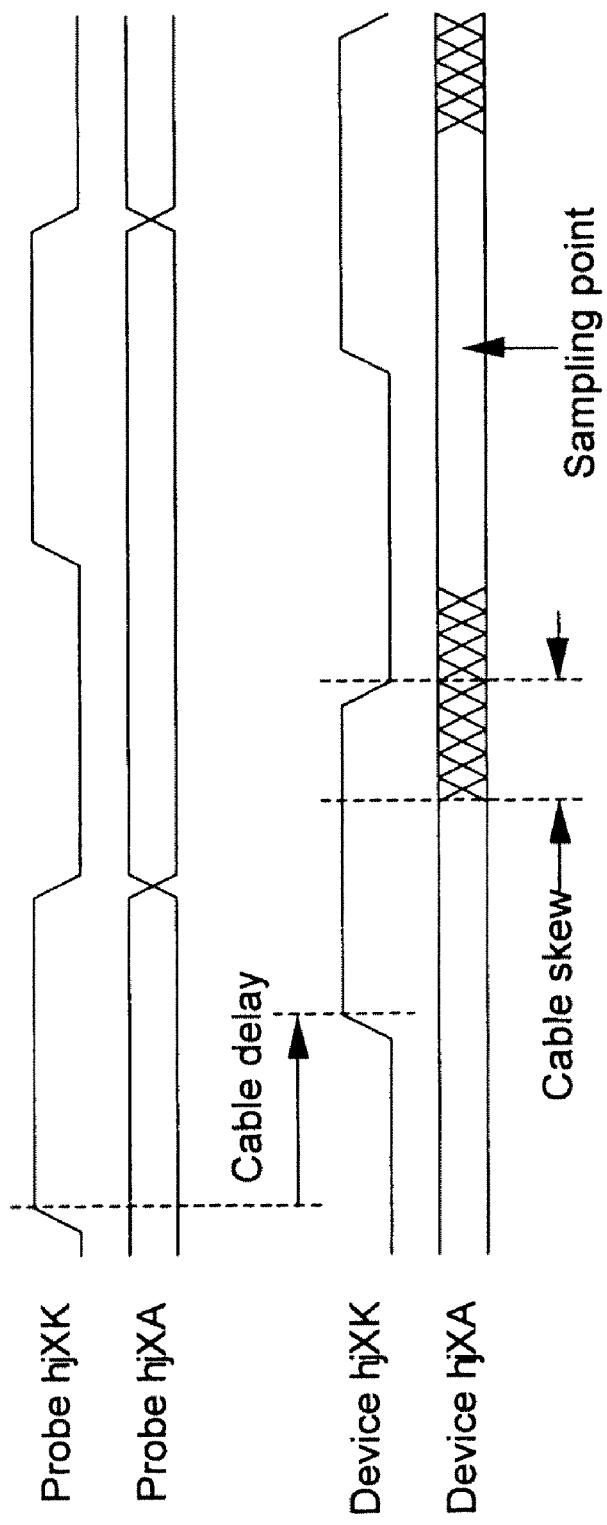
FIG. 11: HyperJTAG Probe Transmitter Phase Alignment

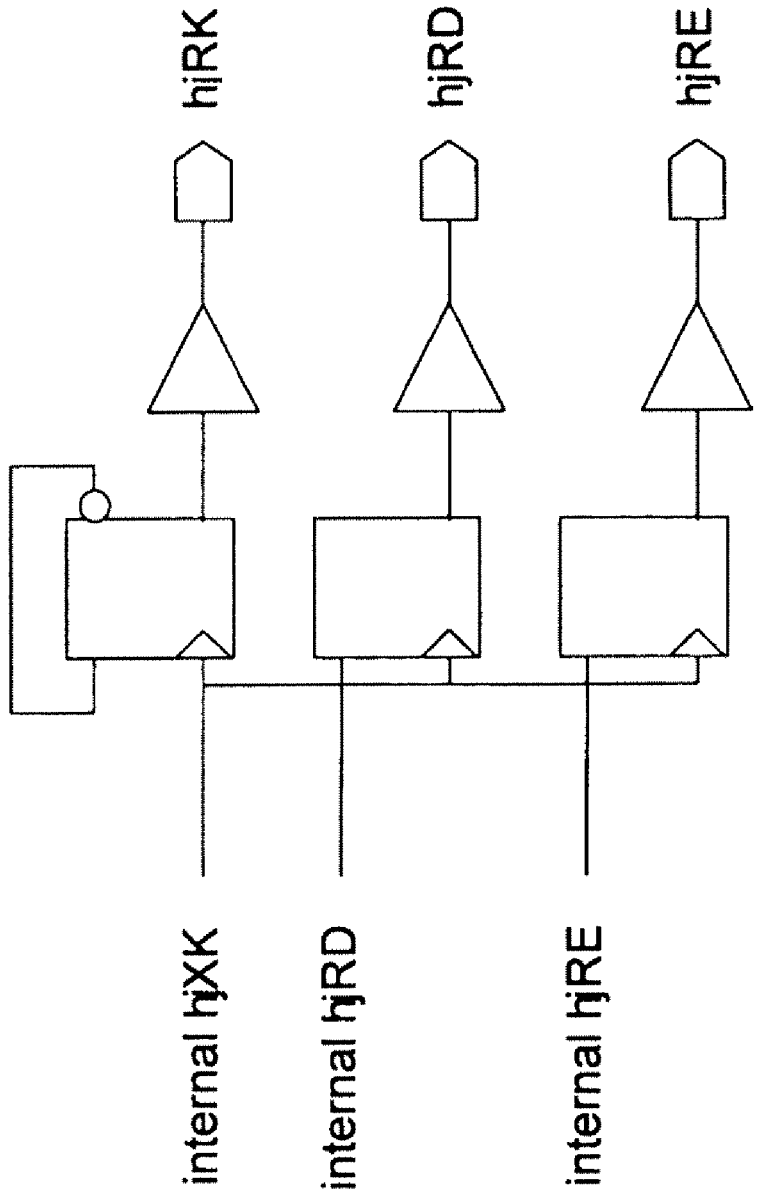
FIG. 12: HyperJTAG OCI Transmitter I/O Structure

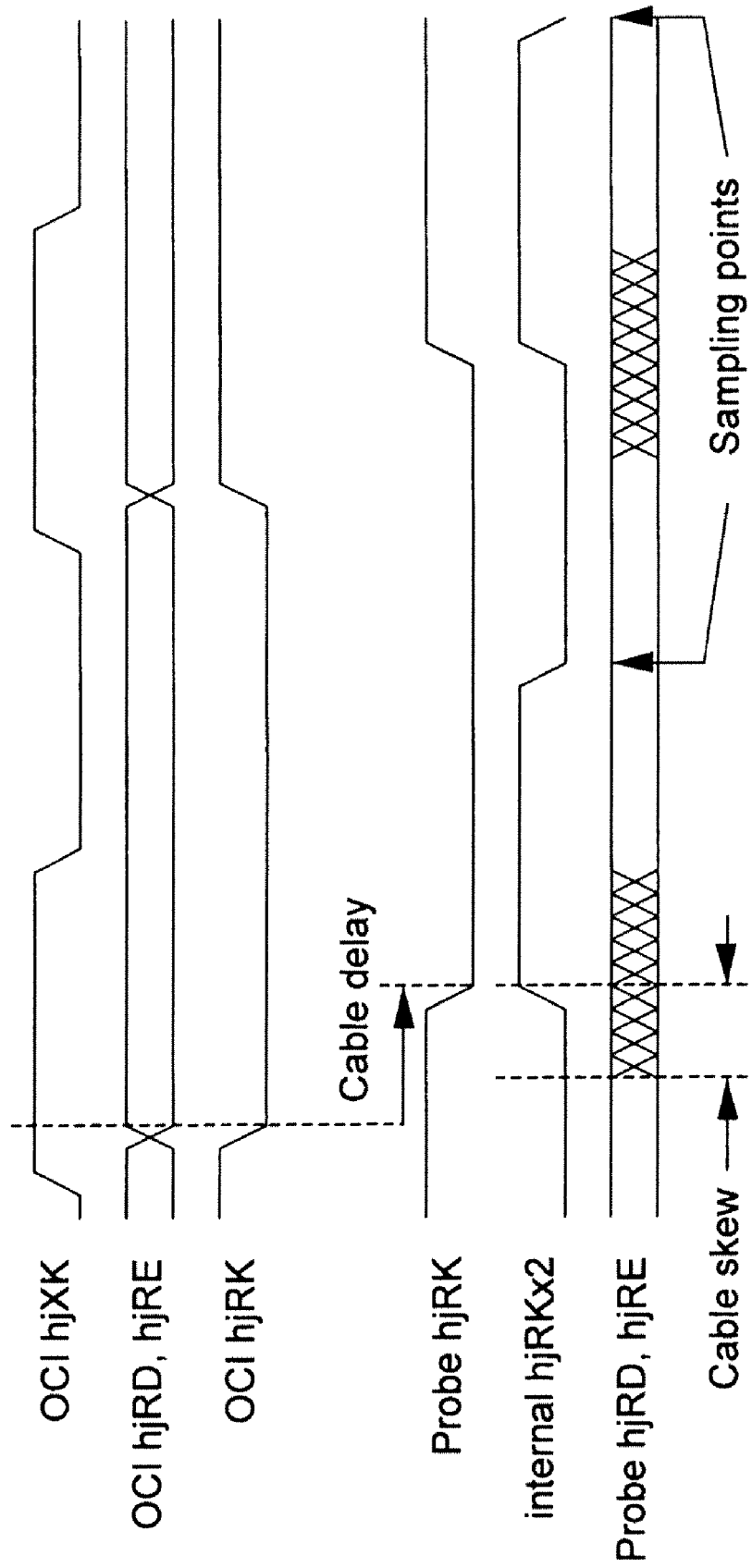
FIG. 13: HyperJTAG Probe Receiver Timing

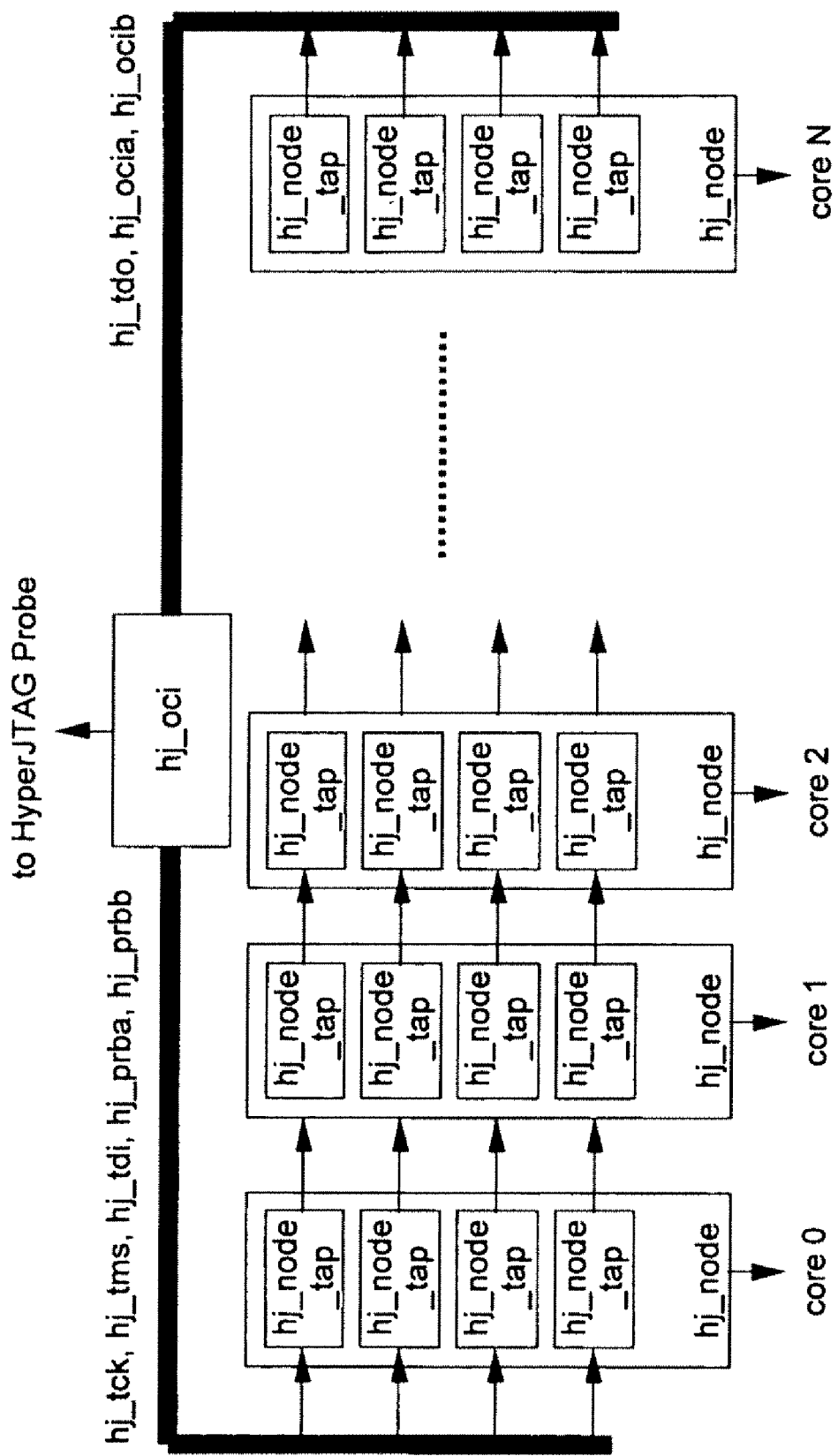
FIG. 14: HyperJTAG RTL Organization

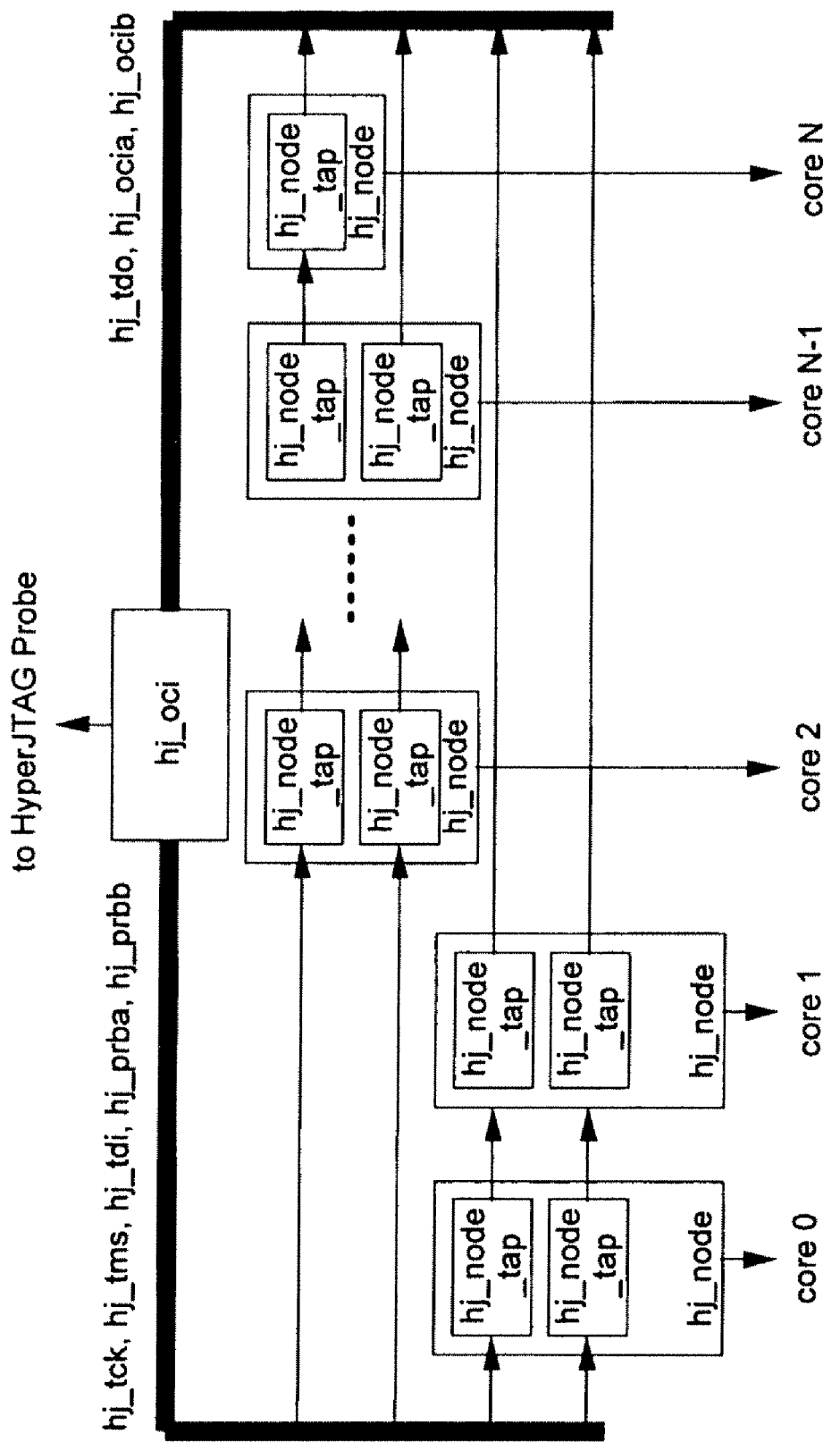
FIG. 15: HyperJTAG Implementation Example

HYPERJTAG SYSTEM INCLUDING DEBUG PROBE, ON-CHIP INSTRUMENTATION, AND PROTOCOL

CROSS REFERENCE TO RELATED APPLICATIONS

This application is a continuation of U.S. patent application Ser. No. 11/026,324 filed Dec. 29, 2004 entitled, "Hyperjtag System Including Debug Probe, On-Chip Instrumentation, and Protocol", which claims priority from U.S. Provisional Patent Application No. 60/533,331 filed Dec. 29, 2003, the contents of each of the two applications are incorporated herein by reference.

BACKGROUND OF INVENTION

The present invention relates to a system for simultaneously interfacing with and debugging multiple processor cores on an integrated circuit device.

System-on-a-Chip (SoC) refers to integrated circuits that are generally custom made for a specific application and contain at least one processor core, memory, and/or peripheral devices. A processor core provides computational capabilities through fetched program and data memory accesses. For purposes of this specification, the term "processor core" refers to devices including, but not limited to a CPU (central processing unit), Core, CPU Core, Core Device, IP (intellectual property) cores, JTAG UART, logic analyzer cores, microprocessors, and/or any mechanism suitable for testing, validating, and/or debugging. An SoC device may include multiple processor cores. Some SoC devices are homogeneous (having identical processor cores); others are heterogeneous (having different processor cores).

Developing an SoC device is a multi-step process. Early design steps are generally done virtually on paper or on a computer. These virtual designs are often referred to as pre-silicon models. The pre-silicon model may be, for example, designed, developed, tested, debugged, and validated on an engineering workstation with synthesis and simulation tools. Then, a first silicon device is created. The first silicon device may be a field programmable gate array (FPGA) or a first run application-specific integrated circuit (ASIC) (generally smaller than a full run) of what is expected to become the final embodiment of the SoC device. The first silicon device may include enhancements for software and hardware debugging. The first silicon device is then tested, debugged, and validated. If these tests are successful, the SoC device may be mass-produced.

On-chip debug capability is rapidly becoming the method-of-choice for developing and integrating SoC device application code. More recently, the process of on-chip debugging aids pre-silicon hardware-based simulation and first silicon debug and validation. With the explosive growth in SoC designs and new processor cores, more features and functions are being integrated into the silicon. At the same time, processor speeds are increasing rapidly and time-to-market pressures are greater than ever. Further, design constraints make it difficult for traditional debug tools to interface and work properly in SoC designs.

Joint Test Access Group (JTAG) is a set of standard signals and a protocol (IEEE Standard 1149.1) used to communicate to a device. The JTAG source is the master and the chip it is communicating with is a slave. JTAG provides a means of sending data to the device and reading data back from the device. JTAG is a real-time protocol. As such, it requires a probe (e.g. a JTAG master) that must simultaneously transmit and receive data. The JTAG protocol does not provide means for waiting. For example, a slave device cannot request a master device to wait for access.

A fundamental requirement of any debug system for SoC devices is integration with off-the-shelf probes and software. Typically, off-the-shelf debug probes use the standard JTAG protocol but not a standardized physical connector and, therefore, cannot share the connector with other off-the-shelf probes. A few standardized JTAG-software devices exist, such as JTAG Servers, but these require modifications to the debug software on the off-the-shelf probes.

One attempt to address the ever-changing demands of on-chip testing and debugging utilizes a traditional in-circuit emulator (ICE) that connects to numerous device pins including address, data, and control signals. This solution is problematic because it is practically impossible to actively manipulate and interface to an SoC device due to the SoC's limited quantity of pins and limited access of the control and status signals that traditional ICEs require.

Another attempt to test and debug SoC integrations uses a modified ICE device. The modifications include a component called a "bond-out" or "test" chip. These modified ICE devices "bond out" or wire from the chip die all the required debug signals to external pins. This approach is no longer practical because of the difficulty of maintaining two-versions of the rapidly evolving SoC designs and the limitation of package pins.

Logic analyzers are ineffective tools for testing and debugging in the SoC environment because, in many instances, signals for tracing are not available at the processor pins. In some cases, all the debug logic is on-chip, including processor and/or bus trace and triggering. Further, for SoCs with external trace ports, to properly trace and view the trace results, the traditional logic analyzer must first be customized and configured to interface with the specific SoC device. As a result of this customization, overall product development cycle times and costs increase undesirably.

Existing test and measurement instruments inadequately address design flexibility needs for multiple core debug and test. For example, SoC device designers need design flexibility to incorporate multiple homogeneous and/or heterogeneous processor cores from various third-party sources. These processor cores, for instance, can include a Reduced Instruction Set CPUs (RISC) processor, a Digital Signal Processor (DSP), on-chip instrumentation blocks for bus-trace, triggering, and performance-analysis. For most cases, each of the processor cores uses a standardized JTAG interface-port for control and debug purposes including, for example, start-stop execution, program download, memory and register access, and hardware breakpoint programming. For example, on OCI® brand on-chip instrumentation blocks, the JTAG port is used to program trigger-conditions, acquisition modes, monitor operating state, retrieve trace data, and retrieve measurement data.

Inaccessibility of the control and bus signals plagues many current SoC device designs. The lack of the physical pins on these highly integrated chips often blocks access for traditional off-chip instrumentation, such as debug probes. This creates great difficulty in verifying the operation of first silicon devices and creates many hardware and software integration roadblocks that adversely affect the time-to-market.

One traditional solution for debugging multiple processor cores on an SoC device is to include one physical Joint Test Access Group (JTAG) port on integrated circuit (IC) for each on-chip controllable processor core. If each processor core requires its own JTAG port at the edge of the chip, then physical pin requirements would consume package real estate, making multi-processor core SoC devices impractical. A lack of silicon area for the logic and memory blocks, typically, is not the most significant impediment to SoC debugging. Rather, the most significant impediment to SoC debugging is a lack of pins. For example, a multi-processor core SoC device with dedicated and separate JTAG ports for each processor core would require a corresponding set of five JTAG pins and a dedicated pin for break input and another dedicated pin for go-halt status. Dedicating five pins per processor core wastes pins as a resource. Consequently, each processor core cannot accommodate a dedicated JTAG port.

Sharing access to a common external JTAG port is another traditional solution for test, debug, and validation of multiple-processor core SoC devices. For example, multiple debugging devices share the access to multiple on-chip processor cores by daisy chaining each processor core, allowing them to be addressed individually. This solution is problematic because each of the multiple debugging devices, such as commercially available JTAG-enabled probes (test instruments), supports only one specific device, and is, therefore, unable to interact with any of the other multiple processor cores in the chain. Because two individual JTAG debug probes cannot operate simultaneously on the common shared JTAG connection, only one probe could be connected at one time; therefore, only one processor core may be debugged at a time.

One attempt to address port sharing for testing integrated circuits is described in U.S. Pat. No. 6,584,590 (the "Bean reference") entitled "JTAG PORT-SHARING DEVICE." The Bean reference specifies a port-sharing probe that switches multiple JTAG inputs to one JTAG port on the integrated circuit under test. The Bean reference describes a system in which only one probe at a time may access this common JTAG connection, thus limiting debug to only one processor core at a time. This, in turn, prevents simultaneous debugging of multiple processor cores and their hardware and software interactions.

BRIEF SUMMARY OF THE INVENTION

The present invention relates to simultaneously interfacing multiple test instruments with an integrated circuit device having multiple processor cores. The present invention may be used for simultaneous debugging of the multiple processor cores.

The present invention is directed to concentrator and de-concentrator system for simultaneously interfacing a plurality of test instruments with a plurality of processor cores on an integrated circuit. The system includes an on-chip instrumentation, a probe, and a connection mechanism for providing a transmission path between the probe and the on-chip instrumentation. The on-chip instrumentation includes an on-chip instrumentation concentrator and an on-chip instrumentation de-concentrator. The probe includes a probe concentrator and a probe de-concentrator. The probe concentrator concentrates (e.g. multiplexes and/or interleaves) a plurality of signals from the test instruments into a first serial signal stream for transmission over the connector mechanism. The on-chip instrumentation de-concentrator de-concentrates the first serial signal stream into a plurality of signals to be directed to at least one of the processor cores. The on-chip instrumentation concentrator concentrates (e.g. multiplexes and/or interleaves) a plurality of signals from the processor cores into a second serial signal stream for transmission over the connector mechanism. The probe de-concentrator de-concentrates the second serial signal stream into a plurality of signals to be directed to at least one of the testing instruments. Using this system, the testing instruments are able to simultaneously access and control respective ones of the processor cores. In one preferred embodiment the plurality of signals are directed to the processor cores using a plurality of loops, each loop having a chain of nodes, each of the processor cores connected to at least one of the nodes.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 1 is a block diagram of an exemplary embodiment of the HyperJTAG probe and HyperJTAG on-chip instrumentation of the present invention providing simultaneous interface capabilities between a plurality of test instruments and a plurality of processor cores on an SoC device.

FIG. 2 is an alternative block diagram of an exemplary embodiment of the HyperJTAG probe and HyperJTAG on-chip instrumentation of the present invention providing simultaneous interface capabilities between a plurality of test instruments and a plurality of processor cores on an SoC device.

FIG. 3 is a circuit diagram of an exemplary embodiment of an exemplary HyperJTAG probe (including both multiplexer means and de-multiplexer means) and an exemplary HyperJTAG on-chip instrumentation (including both multiplexer means and de-multiplexer means) of the present invention.

FIG. 4 is a block diagram showing an exemplary dataflow between the HyperJTAG on-chip instrumentation and the HyperJTAG Interface Nodes (HJIN) on a single HJIN chain.

FIG. 5 is a schematic diagram of the logic circuitry of one embodiment of a HyperJTAG Interface Node of the present invention interfacing with a processor core.

FIG. 6 is a schematic diagram of the HyperJTAG Interface Node shown in FIG. 5 in a setup mode.

FIG. 7 is a data table showing common signals for connection standards (JTAG, MIPS, ARM, and ZSP) and exemplary correlations to JTAG signals used in an exemplary embodiment of the present invention.

FIG. 8 is a data table of eight exemplary signals (including the name, source, and purpose) according to an exemplary embodiment of the present invention.

FIG. 9 is a table of an exemplary cycle sequence and timing information of one embodiment of the present invention.

FIG. 10 is a data table of signal delay according to one embodiment of the present invention.

FIG. 11 is a timing diagram of signal phase alignment according to one embodiment of the present invention.

FIG. 12 is a schematic diagram of HyperJTAG probe transmitter input/output structure according to one possible embodiment of the present invention.

FIG. 13 is a timing diagram of the HyperJTAG on-chip instrumentation receiver according to one embodiment of the present invention.

FIG. 14 is a schematic block diagram of the HyperJTAG register transfer logic (RTL) according to one embodiment of the present invention.

FIG. 15 is a schematic block diagram of an exemplary implementation of the embodiment of the register transfer logic (RTL).

DETAILED DESCRIPTION OF THE INVENTION

The present invention is directed to a HyperJTAG system that provides a solution to the shortcomings of traditional test, measurement, and debug instruments for SoC integrated circuit devices (SoC devices) having multiple processor cores. One preferred embodiment of the HyperJTAG system 21 of the present invention includes a HyperJTAG probe 23, HyperJTAG on-chip instrumentation 25 (e.g. a customized OCI® brand on-chip instrumentation set), and an interfacing protocol. The HyperJTAG probe 23 includes multiple independent test instrument connections (shown as interface ports 39) to connect to a plurality of test, measurement, and debug instruments 27 (hereinafter referred to jointly as "test instruments 27") (e.g. vendor debug probes). The HyperJTAG probe 23 connects to the HyperJTAG on-chip instrumentation 25 via a connector mechanism 37 (e.g. a high-speed cable such as a micro-coaxial cable that connects or otherwise forms a transmission path between two 38-position MICTOR® connectors). The HyperJTAG on-chip instrumentation 25, in turn, is connected to chains 51 of HyperJTAG Interface Nodes (HJIN) 33 that are connected to respective processor cores 31 on an SoC device 35. Using the HyperJTAG system 21 of the present invention, the test instruments 27 are able to simultaneously and independently control and access each of the multiple processor cores 31. The HyperJTAG system 21 can interface a multitude of different test instruments 27 promulgated by a number of different vendors with a variety of SoC devices 35 each having multiple processor cores 31.

A multiple processor core SoC device 35 typically includes a plurality (A-N) of individual processor cores 31. Although the plurality (A-N) of individual processor cores 31 may be homogeneous, the plurality (A-N) of individual processor cores 31 may be at least partially heterogeneous. If the processor cores 31 are heterogeneous, they may be different models, they may serve different purposes, or they may be designed and manufactured by different vendors. Each of the heterogeneous processor cores 31 could theoretically require a different test instrument 27. Accordingly, one advantage of the HyperJTAG system 21 of the present invention is that each of a plurality (A-M) of test instruments 27 is able to individually, simultaneously, and/or continuously control and access a respective subset of a plurality (A-N) of processor cores 31. The test instruments 27 may be off-the-shelf test instruments that, without the HyperJTAG system 21 of the present invention, would be unable to share their connection because of the real-time nature of their respective connections.

Regardless of whether the processor cores 31 are homogeneous or heterogeneous, it may be advantageous to be able to interface individually, simultaneously, and/or continuously with each of the plurality (A-N) of processor cores 31. For example, by simultaneously interfacing with all of the processor cores 31, the testing, validating, and/or debugging (hereinafter referred to jointly as "testing") could take into consideration hardware and software interactions of multiple processor cores 31 as they interact during runtime. Accordingly, another advantage of the HyperJTAG system 21 of the present invention is that the test instruments 27 are able to individually, simultaneously, and/or continuously control and access the multiple processor cores 31 while they are running. This can be done without the test instruments 27 interacting with or acknowledging the other test instruments 27. There does not have to be a one-to-one correspondence between the test instruments 27 and the single processor cores 31. For example, a single test instrument 27 may simultaneously control and access more than one single processor core 31. This is especially common when the test instrument 27 supports multiple homogenous cores running concurrently.

In preferred embodiments, the present invention uses standard interface structure (e.g. interface ports) such that the test instruments 27 may be used without requiring special configuration or customization (e.g. hardware or software changes). Accordingly, another advantage of the present invention is that it is able to support multiple third party test instruments 27 without hardware or software configuration or customization.

Yet another advantage of the HyperJTAG system 21 of the present invention is that it conserves both silicon area and pins. The HyperJTAG probe 23 includes multiple interface ports 39 to connect to a plurality of test instruments 27 and, in the shown preferred embodiment, a single interface port 43a to connect (via a transmission path such as a connector mechanism 37) to a single interface port 43b of the HyperJTAG on-chip instrumentation 25. The HyperJTAG on-chip instrumentation 25, in turn, requires only the single interface port 43b to connect (via a transmission path such as a connector mechanism 37) to the HyperJTAG probe 23. Communication over the connector mechanism 37 may be described by the following simplified four step process:

(1) a plurality of signals, each from one of a plurality of test instruments 27, are concentrated (using control software 49 to set the protocol) into a serial signal stream by the HyperJTAG probe 23 prior to transmission over the connector mechanism 37;

(2) after transmission of the serial signal stream over the connector mechanism 37 to the HyperJTAG on-chip instrumentation 25, the serial signal stream is de-concentrated into its original signals by the HyperJTAG on-chip instrumentation 25;

(3) signals from the HyperJTAG on-chip instrumentation (e.g. signals from the plurality of processor cores 31) are returned to the HyperJTAG probe 23 by concentrating the signals into a serial signal stream by the HyperJTAG on-chip instrumentation 25 prior to transmission over the connector mechanism 37 to the HyperJTAG probe 23; and (4) after transmission of the serial signal stream over the connector mechanism 37 to the HyperJTAG probe 23, the serial signal stream from the HyperJTAG on-chip instrumentation 25 is de-concentrated on the HyperJTAG probe 23 into its original signals.

The HyperJTAG system 21 includes appropriate interface protocols for each of the multiple test instruments 27 and its corresponding processor core 31 in the multiple processor core SoC device 35.

Exemplary HyperJTAG System

FIGS. 1-3 illustrate one embodiment of a HyperJTAG system 21 according to the present invention. The HyperJTAG system 21 includes a HyperJTAG probe 23 and HyperJTAG on-chip instrumentation 25 linked by a bidirectional connector mechanism 37.

The HyperJTAG probe 23 is a linking device that includes multiple independent interface ports 39 and a single interface port 43a. Each of the multiple independent interface ports 39 provides a connection interface for linking, via a bidirectional connector mechanism 41 over which bidirectional signals may travel, to a respective test instrument 27. The interface ports 39 may be standard JTAG connectors or alternative connectors known or yet to be developed. The interface port 43a is for connecting (via connector mechanism 37) to an interface port 43b of the HyperJTAG on-chip instrumentation 25. As shown, the HyperJTAG probe 23 may be external to the SoC device 35. The interface port 43a is designed to interface at a high speed with connector mechanism 37. For example, if MICTOR® connectors are used as the connector mechanism 37, then the interface port 43a may be an interface port designed to interface with MICTOR® connectors. Much of the circuitry of the HyperJTAG probe 23 may be implemented on a field programmable gate array 53 (FPGA) to provide the logic for concentration and/or de-concentration. The FPGA 53 may be, for example, a VIRTEX® manufactured by Xilinx, Inc. of San Jose, Calif. or a STRATIX® manufactured by Altera Corporation of San Jose, Calif.

The HyperJTAG on-chip instrumentation 25 is preferably located on the SoC device 35. As mentioned, the HyperJTAG on-chip instrumentation 25 includes interface port 43b for connecting (via connector mechanism 37) to interface port 43a of the HyperJTAG probe 23. The HyperJTAG on-chip instrumentation 25 is also connected to a plurality of chains 51 of HJINs 33. Each HJIN 33 is connected to respective processor core 31 on the SoC device 35. The HyperJTAG on-chip instrumentation 25 expands the single, high-speed, concentrated signal-set into the individual signals rendered by each of the multiple test instruments 27. In addition, the HyperJTAG on-chip instrumentation 25 routes the individual signals to the appropriate corresponding processor core 31. The simultaneous translation and transmission of bidirectional signals between the test instruments 27 and the processor core 31 occurs independently and in real-time over the HyperJTAG system 21. The interface port 43b is designed to interface at a high speed with connector mechanism 37. For example, if MICTOR® connectors are used as the connector mechanism 37, then the interface port 43b may be an interface port designed to interface with MICTOR® connectors. The circuitry of the HyperJTAG on-chip instrumentation 25 may be implemented on the same chip as the processor cores 31. A FPGA (similar to FPGA 53) may be used (particularly for development), or more typically, a mask-programmed Application Specific Integrated Circuit (ASIC) would implement the HyperJTAG on-chip instrumentation 25 and all of the processor cores 31.

It should be noted that the connector mechanism 37 might be any type of transmission path suitable to transport signals at sufficiently high speeds. In one preferred embodiment, the connector mechanism 37 is a high-speed cable such as a micro-coaxial cable. The connector mechanism 37 may also be wireless connections known (e.g. WiFi or BLUETOOTH®) or yet to be developed.

FIG. 3 is a circuit diagram of an exemplary embodiment of an exemplary HyperJTAG probe 23 and an exemplary HyperJTAG on-chip instrumentation 25. Although this figure provides exemplary circuit-level detail, certain aspects of this figure have been simplified. Accordingly, FIG. 3 should be interpreted in view of the other figures. The HyperJTAG probe 23 includes a concentrator 45a (shown as a multiplexer (MUX)) and a de-concentrator 45b (shown as a de-multiplexer (DEMUX)). Similarly, the HyperJTAG on-chip instrumentation 25 includes a de-concentrator 47a (shown as a de-multiplexer (DEMUX)) and a concentrator 47b (shown as a multiplexer (MUX)). FIG. 3 shows the HyperJTAG probe 23 connected to a single test instrument 27. Additional test instruments 27 would be connected using similar circuitry, but a respective input line of the concentrator 45a and a respective output line of the de-concentrator 45b would be connected to each additional test instrument 27. Similarly, additional chains 51 of HJINs 33 would be connected using similar circuitry, but a respective a respective output line of the de-concentrator 47a and input line of the concentrator 47b would be connected to each additional chain 51 of HJINs 33.

Communication Process

As set forth above, to communicate over the connector mechanism 37 is a four-step process.

The first step of the process is that a plurality of signals, each from one of a plurality of test instruments 27, are concentrated (using control software 49 to set the protocol) into a serial signal stream by the HyperJTAG probe 23 prior to transmission over the connector mechanism 37. More specifically, in this first step, the signals from the plurality of test instruments 27 are concentrated using the concentrator 45a prior to transmission over the connector mechanism 37 using control software 49. In the shown embodiment, concentrator 45a receives input from each of four test instruments 27 (only one shown). The control software 49 allocates time "layers" such that the concentrator 45a layers (interleaves) the input signals into a single output signal that carries the serial signal over the connector mechanism 37 to the HyperJTAG on-chip instrumentation 25. For example, test instrument 0 sends a 5-bit signal (e.g. corresponding to TCK (test clock), TDI (test data in), TMS (test mode select), PRBA (probe auxiliary signal A), and PRBB (probe auxiliary signal B)) "00000," test instrument 1 sends a 5-bit signal "11111," test instrument 2 sends a 5-bit signal "01010," and test instrument 3 sends a 5-bit signal "00011." The concentrator 45a interleaves these four signals such that the output of the concentrator 45a is the signal "01000110010001110101."

The second step of the process occurs after transmission of the serial signal stream over the connector mechanism 37 to the HyperJTAG on-chip instrumentation 25. Generally, in this step the serial signal stream is de-concentrated into its original signals by the HyperJTAG on-chip instrumentation 25. More specifically, in this second step the concentrated serial signal stream (originating from the plurality of test instruments 27) is de-concentrated using de-concentrator 47a after transmission over the connector mechanism 37. In the shown embodiment, de-concentrator 47a receives the concentrated serial signal stream as input, de-concentrates the signal, and directs the original signals to a chain 51 of HJINs 33. Only one chain 51 is shown in FIG. 3, but de-concentrator 47a shows four output lines that would correspond to the four chains 51 shown in FIG. 2. The de-concentrator 47a de-concentrates the concentrated serial signal stream by removing the layers (interleaves). For example, the de-concentrator 47a may receive the serial signal stream "01000110010001110101." Using a predetermined protocol, the de-concentrator 47a removes the layers and directs the original signals to an appropriate chain 51 of HJINs 33. For example, the 5-bit signal "00000" from test instrument 0 may be directed to the first chain 51, the 5-bit signal "11111" from test instrument 1 may be directed to the second chain 51, the 5-bit signal "01010" from test instrument 2 may be directed to the third chain 51, and the 5-bit signal "00011" from test instrument 3 may be directed to the fourth chain 51. FIGS. 4 and 5 (discussed below) detail an exemplary dataflow between the HyperJTAG on-chip instrumentation 25, the HJINs 33 on an HJIN chain 51, and the processor cores 31. However, as a preliminary example, the processor cores 31 attached to the predetermined HJINs 33 on the chains 51 receives the appropriate signal. For example, processor core 0 may receive the 5-bit signal from test instrument 0, processor core 1 may receive the 5-bit signal from test instrument 1, processor core 2 may receive the 5-bit signal from test instrument 2, and processor core 3 may receive the 5-bit signal from test instrument 3.

The third step of the process is that signals from the HyperJTAG on-chip instrumentation (e.g. signals from the plurality of processor cores 31) must be returned to the HyperJTAG probe 23. The HyperJTAG on-chip instrumentation 25 concentrates the signals into a serial signal stream prior to transmission over the connector mechanism 37 to the HyperJTAG probe 23. More specifically, in this third step the plurality of signals are concentrated using concentrator 47b prior to transmission over the connector mechanism 37. For example, processor core 0 sends a 3-bit signal (e.g. corresponding to TDO (test data out), OCIA (OCI auxiliary signal A), and OCIB (OCI auxiliary signal B)) "000," processor core 1 sends an 3-bit signal "111," processor core 2 sends an 3-bit signal "010," and processor core 3 sends a 3-bit signal "001." The concentrator 45a interleaves these four signals such that the output of the concentrator 45a is the signal "010001100101."

The fourth step of the process occurs after transmission of the return serial signal stream over the connector mechanism 37 to the HyperJTAG probe 23. Generally, in this step the serial signal stream from the HyperJTAG on-chip instrumentation 25 is de-concentrated on the HyperJTAG probe 23 into its original signals. More specifically, in this fourth step the concentrated serial signal stream (originating from the plurality of processor cores 31) is de-concentrated using de-concentrator 45b after transmission over the connector mechanism 37. Using a predetermined protocol, the de-concentrator 45b removes the layers and directs the original signals to an appropriate test instrument 27. For example, the 3-bit signal "000" from processor core 0 may be directed to test instrument 0, the 3-bit signal "111" from processor core 1 may be directed to test instrument 1, the 3-bit signal "010" from processor core 2 may be directed to test instrument 2, and the 3-bit signal "001" from processor core 3 may be directed to test instrument 3.

Although in the preferred embodiment it takes up to 10 bus cycles (detailed in FIG. 9) for the signals to make a round trip, because of the interleaving and fast speed of transmission the test instruments 27 are able to independently, simultaneously and/or continuously control and access processor cores 31.

Dataflow

FIGS. 4-6 detail an exemplary data in the flow between the HyperJTAG on-chip instrumentation 25, the HJINs 33 on an HJIN chain 51, and the processor cores 31. As shown in FIG. 4, each HJIN chain 51 includes a plurality of HJINs 33. Each HJIN 33 has a plurality of input signals (shown as eight input signals) and a plurality of output signals (shown as eight output signals for all the HJINs 33 on the HJIN chain 51, except the last HJIN 33 on the HJIN chain 51, which has three output signals). It should be noted that if two (or more) HJINs 33 are active on a single chain 31, then the corresponding processor cores 31 would both receive the same signal. This is appropriate when a single test instrument 27 is controlling or accessing more than one processor core 31. It should be noted that the HyperJTAG system 21 is scaleable to any chip size and can support any number of HJIN chains 51 with a selectable subset of processor cores 31 on each HJIN chain 51. The HJIN 33 located near each specific processor core 31, functions to tap that particular processor core 31 into a particular HJIN chain 51.

FIG. 5 shows the logic circuitry of one embodiment of an HJIN 33 interfacing with a processor core 31. The numbered squares (1-5) represent configuration-register bits that control the connection to a specific processor core 31 in a particular HJIN chain 51 targeted for testing. For example, Bit-1 controls the HJIN chain 51 and when tapped in (Bit 1=1), TCK and TMS reach the specific processor core 31 and hj_tdo-out from the HJIN 33 becomes TDO from the same processor core 31—effectively inserting that processor core 31 into the HJIN chain 51. If more than one loop has HJINs 33 at a given processor core 31, the AND-gate and the OR-gate form a multiplexer that selects the specific HJIN chain 51 in which the particular processor core 31 is situated. Bit-2 and Bit-3 control the attachment of the auxiliary inputs hj_prba and hj_prbb to the processor core 31 and Bit-4 and Bit-5 control the auxiliary outputs hj_ocia and hj_ocib. When Bit-5 equals 1, the output-hj_ocia equals input-hj_ocia_in ANDed with ocia from the processor core 31. When Bit-4 equals 0, there is no effect on hj_ocia from the processor core 31. The final hj_ocia leading from the last HJIN 33 to the HyperJTAG on-chip instrumentation 25 is the AND combination of all ocia processor core 31 outputs having an HJIN configuration bit-4 equal to 1. In this example, the hj_ocia_in and hj_ocib_in inputs to the first HJIN 33 in the HJIN chain 51 are set to a constant 1.

FIG. 6 shows the logic circuitry of one embodiment of an HJIN 33 during on-chip Instrumentation Setup. In this mode, the hjMode signal in the link has several functional modes. For example, in normal operating mode, the hjMode signal pulses "high" for one clock every 10-cycles and indicates that the HyperJTAG probe 23 transmitter is transmitting a cycle-0 of the 10-clock sequences (see FIG. 9). When the hjMode signal is high for two clock-cycles, the HyperJTAG system 21 switches to a setup mode. In the setup mode, the HyperJTAG probe 23 sends configuration information through the HyperJTAG on-chip instrumentation 25 down each HJIN chain 51. In the setup mode, the HyperJTAG on-chip instrumentation 25 asserts an output of hj_setup. This output signal is globally distributed to all HJINs 33 connected to that HyperJTAG on-chip instrumentation 25. For example, in the setup mode, five configuration flip-flops form a chain starting at hj_tdi and ending at hj_tdo. The chain is clocked by hj_TCK. The respective processor cores 31 are effectively disconnected while HyperJTAG system 21 is in the setup mode.

To understand FIGS. 7-9, the following example can be used: a test instrument 0 sending the 5-bit signal "00000," test instrument 1 sending the 5-bit signal "11111," test instrument 2 sending the 5-bit signal "01010," and test instrument 3 sending the 5-bit signal "00011." The 5-bit signal corresponds to TCK, TDI, TMS, PRBA, and PRBB as shown in FIGS. 7 and 9. These signals are transmitted from the HyperJTAG probe 23 to the HyperJTAG on-chip instrumentation 25. The concentrator 45a interleaves these four 5-bit signals using the 10-phase sequence shown in FIG. 9 onto the three Transmit Data signals in cable 37—hjxa, hjxb, and hjxc (FIG. 8). In the first phase (cycle 0), hjxa (shown as A in FIG. 9) carries the state of TCK from test instrument 0, hjxb (shown as B in FIG. 9) carries the state of TMS from test instrument 0, and hjxc (shown as C in FIG. 9) carries the state of TDI from test instrument 0. In the second phase (cycle 1), hjxa (shown as A in FIG. 9), hjxb (shown as B in FIG. 9), and hjxc (shown as C in FIG. 9) carry TCK, TMS, and TDI respectively from test instrument 1. The interleave sequence continues as shown in FIG. 9 and transmits all four 5-bit signals at least once during the 10-phase sequence.

FIG. 7 is a data table showing common signals for JTAG, MIPS, ARM, and ZSP connection standards. As shown, there are eight or fewer signals in a typical instrument connection—four signals dictated by the JTAG standard plus two auxiliary signals traveling in each direction. ARM has eight signals, the four JTAG standard signals plus four signals assigned to the HyperJTAG auxiliary signals (e.g. the OCIB JTAG signal would correspond to the RTCK ARM signal). The MIPS and ZSP have less than eight signals. However, the HyperJTAG system 21 does not interpret the signals; the HyperJTAG system 21 merely passes the signal from the test instruments 27 to their respective processor cores 31 that are able to interpret the signal.

FIG. 8 shows how the HyperJTAG system 21 may be thought of as being available in "slices" of 4 virtual connections, each including TCK (test clock), TDI (test data in), TMS (test mode select), TDO (test data out), and two auxiliary signals in each direction. Each HyperJTAG slice also includes a fifth virtual JTAG connection (F in FIG. 9) dedicated for on-chip instrumentation control. Each direction consists of a clock signal and source-synchronous data signals, for example.

Assuming a 200 MHz clock, a particular TCK or TDO is transmitted once every 5 clock cycles, or about once every 25 nanoseconds (ns) TDI, TMS, and the auxiliary signals are updated once every 50 ns. FIG. 10 illustrates calculated total round-trip delay for one possible embodiment according to the present invention. The signal roundtrip delay is added to the TCK half-cycle period to determine the maximum supported TCK frequency for a particular "test instrument 27—processor core 31" combination. For example, if a test instrument 27 and processor core 31 can operate together in a stand-alone system with a TCK speed of 25 MHz (40 ns cycle), the minimum TCK half-cycle is 20 ns. Adding 95 ns to this results in a 115 ns half-cycle, or a TCK frequency of about 4.35 MHz.

TDI and TMS are changed by the test instrument 27 just after the falling edge of TCK. Using the table of FIG. 10, the TCK edge arrives at the processor core 31 between about 65 ns and about 95 ns after it is driven from the test instrument. This time lapse depends on the synchronization and multiplexer states. The values for TDI and TMS associated with a particular TCK falling edge may arrive as early as the TCK falling edge or they may be delayed by one 10-clock cycle (about 50 ns). Either way, the TDI and TMS values arrive at the processor core 31 in time for sampling by the next rising TCK-edge when it arrives at the processor core 31.

It should be noted that the basic time-base from the HyperJTAG probe 23 can vary as conditions require. A faster clock results in lower latency and, therefore, virtual JTAG links can run faster. A slower clock improves timing margins and might be needed in some low power or FPGA-based designs. This time-base is configured in the control console, for example, in one embodiment of the present invention.

Existing test instruments 27 generate TCK, TDI, and TMS. TCK is an edge-sensitive clock that is asynchronous to all other system clocks and may run continuously or only when there is JTAG activity. TDI and TMS are output after the falling edge and sampled on the next rising edge of TCK. They are sampled at the destination processor core 31 on the SoC device 35. TDO output from the processor core 31 changes after the TCK falling edge and test instrument 27 sampling occurs at the next TCK rising edge. The JTAG protocol imposes a hard limit of ½ TCK to transmit TDI and TMS to the processor core 31 and to receive TDO from the processor core 31.

Corresponding sets of JTAG signals from each respective test instrument 27 pass into the HyperJTAG probe's FPGA 53. The signal-sets then relay through a two-stage synchronizer, a multiplexer, and then to the chip-side output of the FPGA 53. The signal-sets continue over a connector mechanism 37 and, ultimately, the signal-sets are received by the HyperJTAG on-chip instrumentation 25 that is installed in the target SoC device 35. The signal-sets are de-multiplexed and a time-delay is introduced into copies of the original JTAG signals of the respective test instruments. Similarly, TDO from the each processor core 31 on the SoC device 35 is synchronized and transmitted back through the HyperJTAG system 21 to the originating test instrument. For example, FIG. 10 shows a possible round trip delay of signal-sets utilized by the HyperJTAG system 21.

FIG. 11 shows timing signals for the transmitter phase alignment of the HyperJTAG probe 23. As shown in this timing diagram, the HyperJTAG probe 23 adjusts the phase of the source-synchronous clock so that the HyperJTAG on-chip instrumentation 25 receiver can reliably receive data inputs at the rising clock edge, assuming approximately equal delays on the data and clock signals between the test instrument 27 and device. For example, the HyperJTAG probe 23 emits two signals, hjXK and hjXA. However, due to signal delay caused by the connector mechanism 37, the processor core 31 under test receives the signal at a different time interval. This offset is termed "cable skew."

Clock Generation and Reception

To eliminate the need for timing-critical global clocks, the HyperJTAG configuration register is implemented as a 5-bit shift register. The 5-bit shift register's input is clocked at the rising edge of TCK and its output appears at the falling edge of TCK, similar to a JTAG register. TCK skew must be managed within each HJIN 33, however, this does not create a problem between HJINs 33.

The HyperJTAG probe 23 adjusts the phase of the source synchronous-clock so the HyperJTAG on-chip instrumentation 25 receiver can reliably receive data input at the rising clock-edge, assuming approximately equal delays on the data and clock signals between the test instrument 27 and the SoC device 35, as shown, for example, in FIG. 11.

To simplify implementation of the output structure of the HyperJTAG on-chip instrumentation 25, both the HyperJTAG on-chip instrumentation 25 receiver and HyperJTAG on-chip instrumentation 25 operate on the rising edge of the received hjXK clock. The HyperJTAG on-chip instrumentation 25 produces a half-speed hjRK signal using the same output structure as the hjRD and hjRE signals, as shown in FIG. 12. A constraint is imposed on the skew between hjRK and the two data outputs. However, it is generally easier to align outputs that are both generated from registers than to align a register output to a combinatorial clock output.

FIG. 13 is a timing diagram of the HyperJTAG probe 23 HyperJTAG on chip instrumentation 25 receiver according to one embodiment of the present invention. In this embodiment, the HyperJTAG on-chip instrumentation 25 receiver constructs a full-speed sampling clock by doubling and phase-shifting hjRK. This sampling clock is used to receive reliably the two data signals hjRD and hjRE.

If there is no HyperJTAG probe 23 connected to a SoC device 35, the 10 hjXK switch does not toggle. Accordingly, the power consumption of the HyperJTAG on-chip instrumentation 25 and HJINs 33 is minimal.

HyperJTAG RTL Organization

FIG. 14 is a schematic block diagram of the HyperJTAG register transfer logic (RTL) according to one embodiment of the present invention. When considered from an RTL perspective, the HyperJTAG on-chip instrumentation 25 is an independent module. At each specific processor core 31, an hj_node-module contains all the HJINs 33, and the AND-OR combining gates. Initialization parameters control the number of HJIN chains 51 initiated and into which HJIN chains 51a particular processor core 31 can tap.

Each hj_node_tap module corresponds to one HJIN 33. Each hj_node module is instantiated with an hj_node_map input, a bitmap containing 1's in bit positions corresponding to HJINs (tap node) 33 sites that are populated. Unpopulated sites are optimized out during synthesis. Note that hj_node may contain any number of HJIN chains 51—more than four are possible if there is more than one hj_oci in a system.

If desired, RTL can be organized to separate the HJIN chains 51 rather than routing all of them to each hj_node. For example, FIG. 15, shows instantiated hj_nodes on two separate HJIN chains 51.

Interfacing Protocol

One preferred embodiment of the present invention is described as using JTAG signals as an exemplary interfacing protocol between the HyperJTAG system 21 and the test instruments 27 and between the HyperJTAG system 21 and the processor cores 31. JTAG has many advantages as a protocol including that it is a "real-time" protocol and that is used by a large number of test instruments 27 and processor cores 31.

One preferred embodiment of the present invention uses a uniquely defined interfacing protocol to concentrate test instrument signals onto a set of high-speed serial signals for transmission. The present invention defines the protocol for concentrating multiple JTAG signal sets onto one set of signals taking into consideration the constraints that the JTAG signals must adhere to in order to make the system work.

One aspect of the invention is that it is scalable, which means the protocol and implementation can support different number of on-chip processor cores 31. This is important for handling any number of different SoC device 35 configurations that can include both homogeneous and heterogeneous processor cores 31. There is no provision in JTAG for a slave to request the master to wait for access. This means that the concentrator must accommodate all virtual JTAG connections simultaneously. The JTAG protocol imposes a hard limit of ½ TCK to transmit TDI and TMS to the processor core 31 and to receive TDO from the processor core 31. The interface port and de-concentrator for testing multiple independent on-chip processor cores 31 in which the test signals are any other serial digital protocol using eight signals or less. (Examples are Zilog ZDI for eZ80, Motorola BDM for 68300, and Motorola OnCE for 56000.) The interface port and de-concentrator for testing multiple independent processor cores 31 in which the concentrator hardware protocol provides a mode in which the integrated circuit concentrator signals are used to program and configure the de-concentrator and individual interface ports to each processor core 31 to accommodate user programmability.

The Bean Reference

The Bean reference discussed in the Background can be easily distinguished from the present invention. The Bean reference discloses a port-sharing probe that switches multiple JTAG inputs to one JTAG port on the integrated circuit under test. The Bean debug approach, therefore, describes a serial debugging probe. Each configuration described in the Bean reference allows only one processor core on the multiple processor core SoC device to be debugged at a time. This limitation occurs because the separate JTAG-enabled debug probes cannot operate simultaneously on the single, shared JTAG interface port. Accordingly, the Bean reference is incapable of simultaneous debugging of multiple processor cores.

Miscellaneous

It should be noted that the exemplary signals (and exemplary components) are described primarily as JTAG signals (and components) because JTAG is one of the most popular connection standards currently being used. The invention as shown, however, could be used with many alternative connection standards including, but not limited to Background Debug Mode (BDM) devised by Motorola Inc. and Zilog Debug Interface (ZDI) used on cores created by Zilog, Inc. The shown embodiment would be limited to connection standards having five or fewer downstream and three or fewer upstream connections. It should be noted, however, that alternative embodiments could include a higher number of connections, which would make the present invention suitable for connection standards having more than five downstream or more than three upstream connections.

It should be noted that the test instruments 27 might be debug probes and/or test probes. It should be noted that a debug probe test instrument may be a JTAG master debug probe that may be, for example, an off-the-shelf or custom-made debug-probe. For example, exemplary off-the-shelf debug probes that may be used with the present invention include JTAG Debugger for ARM7 from Lauterbach, Inc. of Marlborough, Mass., MAJIC-LT JTAG debug probe for ARM from Embedded Performance, Inc. (EPI) of Milpitas, Calif., LC-500 JTAG emulator from American Arium of Tustin, Calif., EMUL-ARM JTAG debug probe from Nohau Corporation of Campbell, Calif., and In-Target System Analyzer from First Silicon Solutions, Inc. of Lake Oswego, Oreg. Non-JTAG-enabled test instruments 27 (e.g. the ZDI from ZiLog Inc. of San Jose, Calif.) may also be used with the present invention because the HyperJTAG system 21 serves as a pass-through conduit and does not interpret the signals. It should be noted that the number of test instruments 27 shown is meant to be exemplary and is not meant to limit the scope of the invention. Although discussed only as a test instrument, it should be understood that the test instrument would include software or other guided-user interfaces (GUI) 29. It should be noted that a single GUI 29 may be used for multiple test instruments 27.

It should be noted that all JTAG-based processor cores 31, known or unknown, are supported. The scalable HyperJTAG system 21 of the present invention supports a wide variety of different on-chip processor cores 31 and, accordingly, the system adapts to any number of different SoC device 35 configurations including multiple homogeneous processor cores 31, multiple heterogeneous processor cores 31, or combinations of both. For example, exemplary processor cores 31 that may be used with the present invention include MIPS4K™, MIPS5K™, and MIPS24K™ from MIPS Technologies, Inc. of Mountain View, Calif., ARM7 and ARM9 from ARM of Cambridge, U.K., ZSP500 from LSI Logic Corporation of Milpitas, Calif., and CEVA-Teak, CEVA-TeakLite, CEVA-Oak, and CEVA-Pine from Ceva, Inc. of San Jose, Calif. Non-JTAG-enabled processor cores 31 (e.g. the eZ80 from ZiLog Inc. of San Jose, Calif.) may also be used with the present invention because the HyperJTAG system 21 serves as a 30 pass-through conduit and does not interpret the signals. It should be noted that the HyperJTAG system 21 accommodates the JTAG test-port of non-CPU processor cores, such as, bus monitor modules or performance analysis modules. It should be noted that the number of processor cores 31 shown is meant to be exemplary and is not meant to limit the scope of the invention.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A port-sharing device, comprising:
multiple processor cores on a chip, at least a sub-set of processor cores being coupled to corresponding off-chip test probes, wherein communication of signals between a specific processor core of the sub-set of processor cores and a corresponding off-chip test probe is interleaved in time layers with signals from each of the remaining processor cores in the sub-set of processor cores, wherein processor cores of the sub-set of processor cores are independently and simultaneously controlled.

2. The port-sharing device of claim 1 wherein the multiple processor cores comprise homogeneous processor cores.

3. The port-sharing device of claim 1 wherein the multiple processor cores comprise heterogeneous processor cores.

4. The port-sharing device of claim 1 wherein the multiple processor cores comprise a first group of homogeneous processor cores and a second group of heterogeneous processor cores.

5. The port-sharing device of claim 1 wherein at least one off-chip test probe is a JTAG probe.

* * * * *